(12) United States Patent
Frey et al.

(10) Patent No.: US 9,214,485 B2
(45) Date of Patent: Dec. 15, 2015

(54) THICK MULTILAYER INTERFERENCE FILTER HAVING A LOWER METAL LAYER LOCATED WITHIN AN INTERCONNECT REGION

(71) Applicants: STMicroelectronics SA, Montrouge (FR); Commissariat A L'Energie Atomique et aux Energies Alternatives, Paris (FR)

(72) Inventors: Laurent Frey, Grenoble (FR); Michel Marty, Varces (FR)

(73) Assignees: STMicroelectronics SA, Montrouge (FR); Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/452,702

(22) Filed: Aug. 6, 2014

(65) Prior Publication Data

US 2015/0041943 A1  Feb. 12, 2015

(30) Foreign Application Priority Data

Aug. 8, 2013 (FR) ...................................... 13 57901

(51) Int. Cl.
*H01L 27/146* (2006.01)
*G02B 5/28* (2006.01)

(52) U.S. Cl.
CPC .......... *H01L 27/14621* (2013.01); *G02B 5/288* (2013.01); *H01L 27/14636* (2013.01); *H01L 27/14685* (2013.01); *G02B 5/28* (2013.01); *H01L 27/14645* (2013.01); *H01L 27/14649* (2013.01)

(58) Field of Classification Search
USPC ..................................... 257/432; 438/70, 687
See application file for complete search history.

(56) References Cited

U.S. PATENT DOCUMENTS

| | | | | |
|---|---|---|---|---|
| 6,031,653 A | * | 2/2000 | Wang ...................... | G02B 5/288 359/247 |
| 7,811,725 B2 | * | 10/2010 | Chen ....................... | G02B 5/201 359/589 |
| 2004/0095645 A1 | * | 5/2004 | Pellicori ................ | B41M 3/003 359/584 |
| 2006/0169878 A1 | * | 8/2006 | Kasano .................. | G02B 5/201 250/226 |
| 2008/0108170 A1 | | 5/2008 | Adkisson et al. | |
| 2009/0008730 A1 | * | 1/2009 | Roy et al. ........................ | 257/432 |
| 2009/0302407 A1 | * | 12/2009 | Gidon et al. ................... | 257/432 |
| 2010/0102410 A1 | * | 4/2010 | Shimizu et al. ............... | 257/435 |

(Continued)

FOREIGN PATENT DOCUMENTS

WO   WO-2008012235 A1   1/2008

OTHER PUBLICATIONS

INPI Search Report and Written Opinion for FR 1357901 mailed Mar. 28, 2014 (7 pages).

*Primary Examiner* — Marc Armand
*Assistant Examiner* — Younes Boulghassoul
(74) *Attorney, Agent, or Firm* — Gardere Wynne Sewell LLP

(57) ABSTRACT

A multilayer optical filter is provided for an integrated circuit including a substrate and a metallization layer interconnection part. The optical filter is formed from a first filter part located within the interconnection part and positioned over a photosensitive region of the substrate. The optical filter further includes a second filter part positioned above the first filter part and the interconnection part. The first and second filter parts each include a metal layer. The first and second filter parts are separated from each other as a function of a wavelength in vacuum of an optical signal to be filtered and received by the photosensitive region.

16 Claims, 4 Drawing Sheets

(56) References Cited

U.S. PATENT DOCUMENTS

| | | |
|---|---|---|
| 2010/0308427 A1 | 12/2010 | Lenchenkov |
| 2011/0032398 A1* | 2/2011 | Lenchenkov ............ 348/294 |
| 2011/0204463 A1* | 8/2011 | Grand .................. G02B 5/201 257/432 |
| 2015/0036133 A1* | 2/2015 | Uematsu ................. G01J 3/51 356/300 |

* cited by examiner

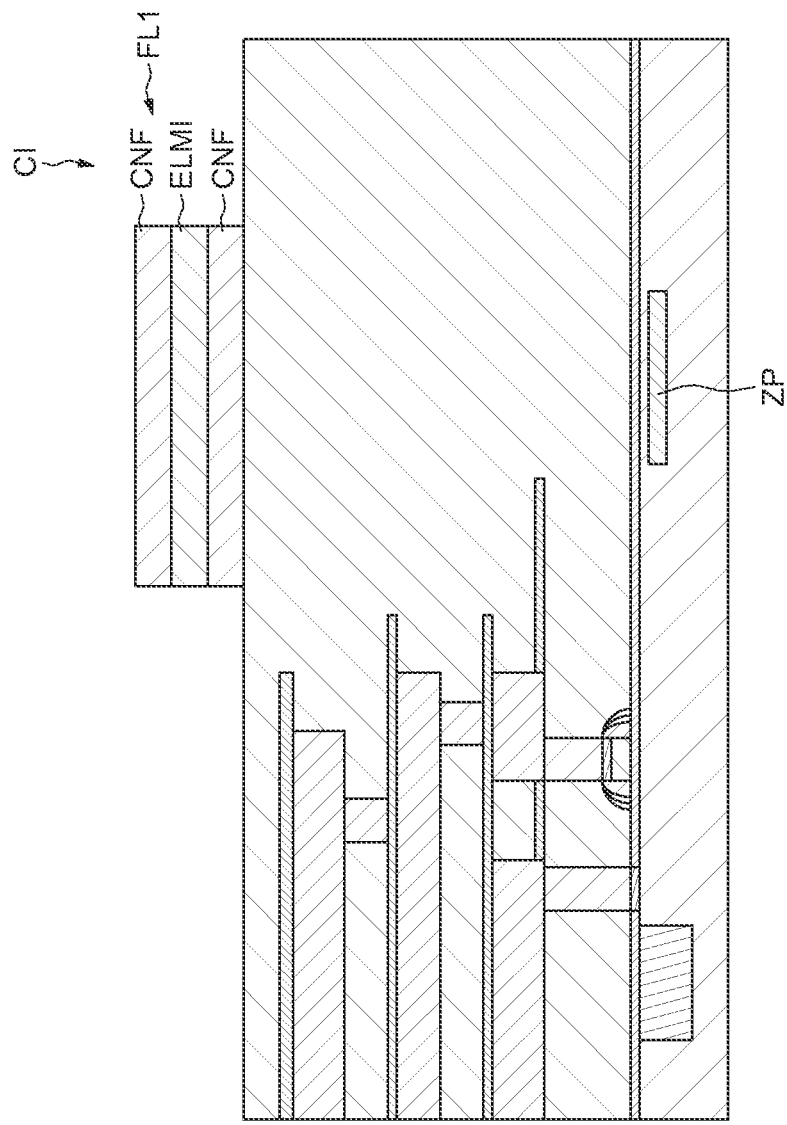

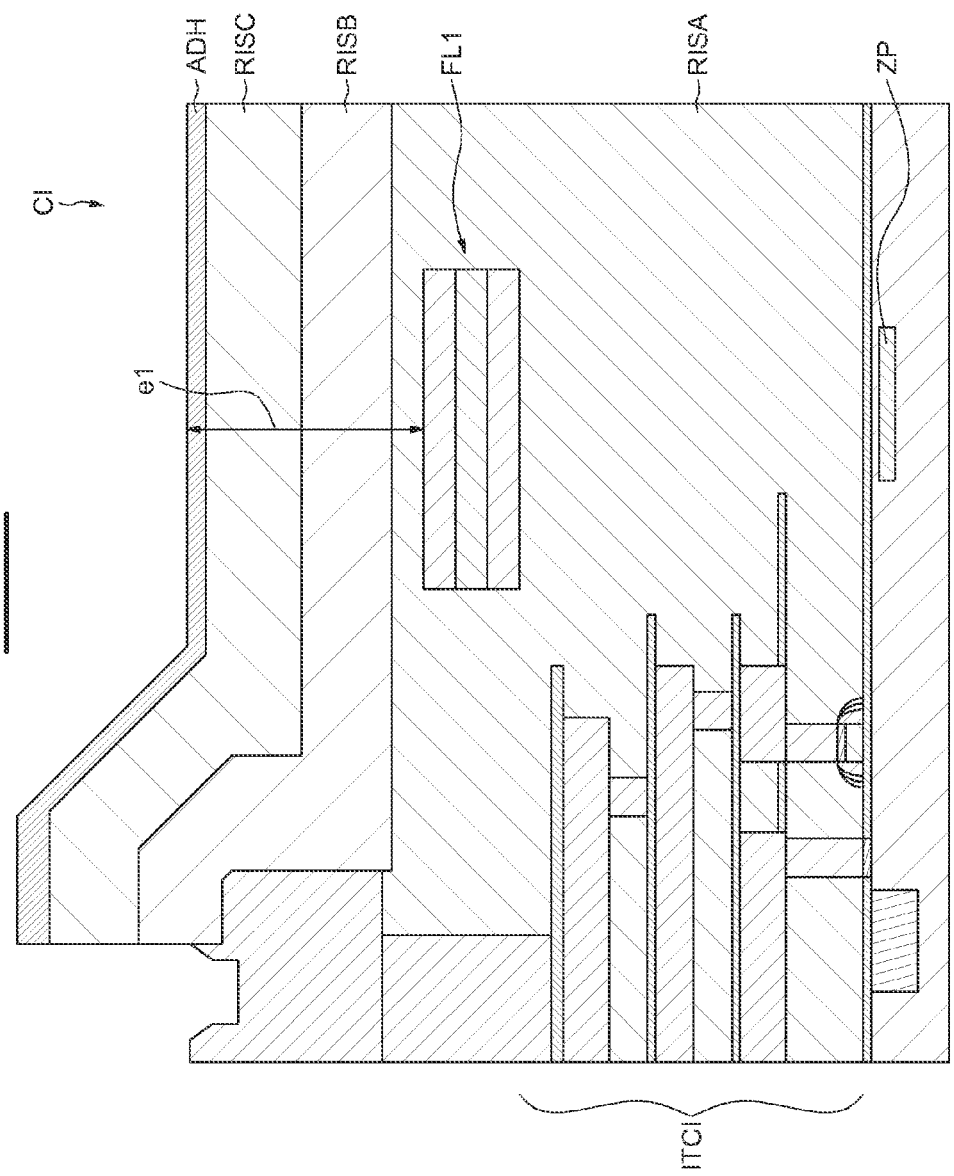

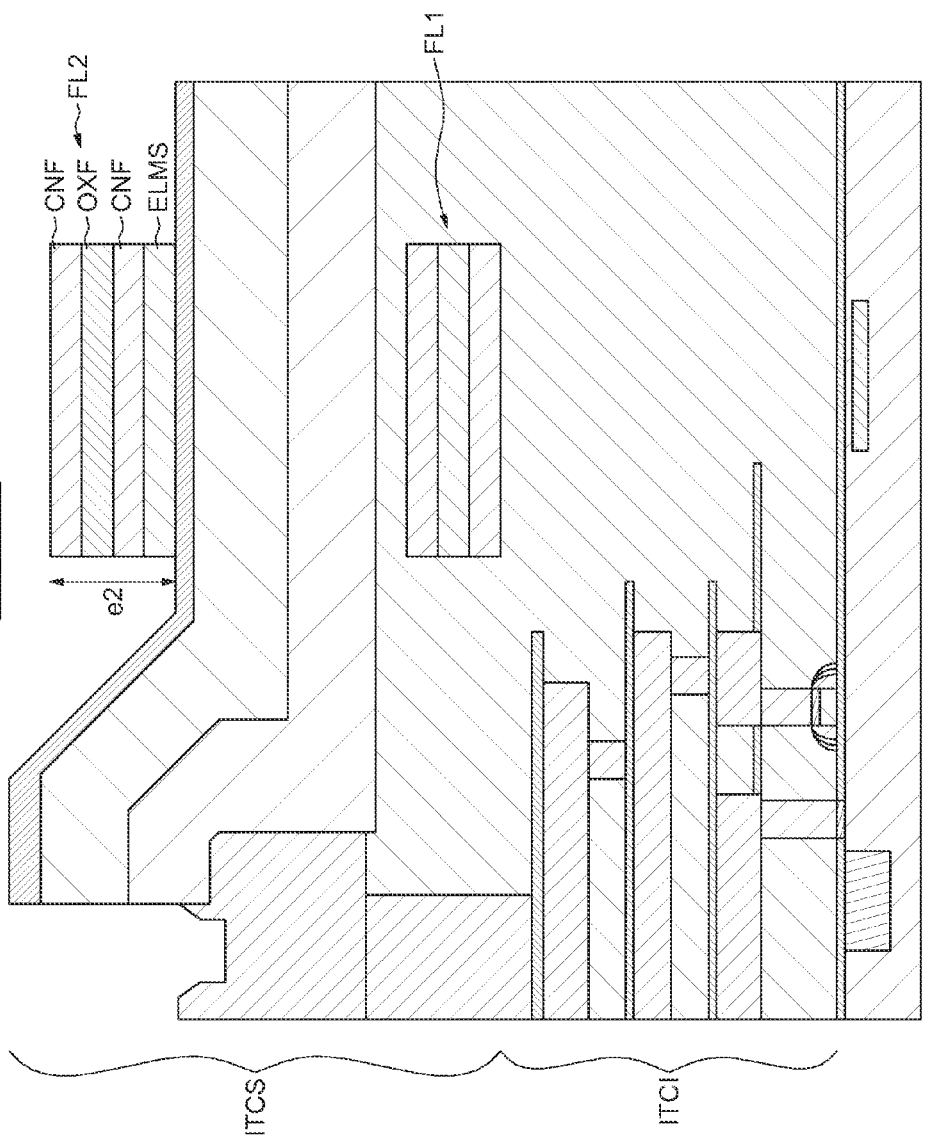

THICK MULTILAYER INTERFERENCE FILTER HAVING A LOWER METAL LAYER LOCATED WITHIN AN INTERCONNECT REGION

PRIORITY CLAIM

This application claims priority from French Application for Patent No. 1357901 filed Aug. 8, 2013, the disclosure of which is incorporated by reference.

TECHNICAL FIELD

The invention relates to the formation of multilayers of different materials, in particular for the formation of multilayer optical filters designed to filter, in other words to allow the passage of, various types of light radiation in the visible or infrared range, and which are used in imaging devices.

BACKGROUND

The imaging devices generally comprise a set of pixels each having a semiconductor photosensitive region disposed under an optical filter integrated within the imaging device, for example a colored filter. Groups of pixels with red, green and blue filters may notably be used, for example in such a manner as to form Bayer patterns well known to those skilled in the art.

The optical filters designed to only let a single color through generally comprise a resin filter colored by pigments. These filters have the drawback of not being sufficiently robust and of not being sufficiently selective with respect to certain types of radiation, notably infrared radiation.

Alternatives to pigmented resins have therefore been provided.

Multilayer optical filters are also known, which are sometimes referred to as resonant filters, for filtering a type of radiation. These multilayer optical filters comprise a layer of a dielectric material generally disposed between two metal layers in order to form filters. The thickness and the optical characteristics of this dielectric layer notably determine the frequency of resonance of the resonator and they thus determine the wavelength of the photons that are able to reach a photosensitive region disposed under the filter. These multilayer filters may be filters designed to allow the visible colors or else infrared radiation to pass through. They may notably be disposed on top of imaging devices such as avalanche photodiodes triggered by a single photon (Single Photon Avalanche Diode).

Reference may be made to the published PCT Application WO 2008/012235 (incorporated by reference) which describes an imaging device comprising metal/dielectric multilayer filters formed on top of an interconnection part of an integrated circuit, over photosensitive regions. This interconnection part is commonly denoted by the acronym BEOL for "Back End Of Line". The multilayer filters described in this document have the drawback of having too low a transmission in the neighborhood of the wavelength to be allowed through. These multilayer filters also have the drawback of not offering a high enough rejection of the wavelengths that it is desired to block.

SUMMARY

According to one embodiment and its implementation, a method is provided for fabricating a multilayer optical filter and an integrated circuit comprising a multilayer optical filter, the optical filter having an improved transmission in the neighborhood of the wavelength to be allowed through, and a high rejection for the other wavelengths.

According to one aspect, a method is provided for fabricating a multilayer optical filter within an integrated circuit comprising a substrate and an interconnection part.

According to one general feature of this aspect, the fabrication of the optical filter comprises the formation of a first filter part within the interconnection part on top of a photosensitive region situated within the substrate, and the formation of a second filter part above the first filter part and the interconnection part.

In contrast to the filters according to the prior art, here, a part of the filter is buried within the interconnection part. A filter having a greater total thickness, and in particular a greater thickness of resonant cavity, can thus be formed which allows the optical properties of the filter to be improved.

It is observed that, by increasing the thickness of the multilayer optical filters, in particular the thickness separating the two metal layers of a filter, the optical properties of this filter are improved. It is further observed that it is particularly advantageous to place one of the metal layers within the interconnection part in order to increase the total thickness of the filter, without increasing the thickness of the filter on top of the interconnection part. Indeed, this thickness on top of the interconnection part is generally limited by the thickness of photosensitive resin required for the etching of the filter, and also by the size of the pixels.

Further, the multilayer optical filter is advantageously a sole filter comprising two filter parts, a lower filter part and an upper filter part, separated by layers, generally thick layers, of the interconnection part, the thickness of which being preferably chosen for optimizing the global interferences generated in the whole multilayer optical filter. The interferences occurring in each filter part are mutually correlated, in particular because all interfaces between the filter parts are plane and thus parallel between them.

The formation of the first filter part can comprise: the formation of a lower region of the interconnection part on top of the photosensitive region, and the formation of a lower metal optical filter layer above the lower interconnection region and the photosensitive region.

The formation of the second filter part can comprise: the formation of an upper region of the interconnection part above the lower metal optical filter layer and the lower interconnection region, and the formation of an upper metal optical filter layer above the upper interconnection region and the lower metal optical filter layer.

By forming the lower metal layer, which forms the first filter part, on top of a thin lower interconnection region layer, and by forming the upper metal layer, which forms the second filter part, on top of a thick upper interconnection region layer, the two metal layers can be spaced apart.

The formation of the first filter part and the formation of the second filter part can comprise the formation of a layer of copper between two layers of silicon nitride.

A filter is thus obtained which uses materials generally used in the fabrication of integrated circuits.

The second filter part may thus be formed vertically separated from the first filter part by an optical thickness of interconnection part in the range between 0.4 and 3 times or between 1 and 3 times the wavelength to be filtered in vacuum.

The optical thickness corresponds to the value of the product of the thickness and the refractive index:

The second filter part may be formed by forming a multilayer of layers having a total height above the upper interconnection region comprising for example between 1000 and 1500 nanometers.

According to another aspect, an integrated circuit is provided comprising a substrate, an interconnection part and a multilayer optical filter, characterized in that the multilayer optical filter comprises a first filter part within the interconnection part on top of a photosensitive region situated within the substrate, and a second filter part above the first filter part and the interconnection part.

The interconnection part can comprise a lower interconnection region and an upper interconnection region on top of the lower interconnection region, the first filter part comprising a lower metal layer above the photosensitive region and the lower interconnection region, and the second filter part can comprise an upper metal layer above the upper interconnection region and the lower metal filter layer.

The first and the second filter part can comprise at least one metal layer.

The first and the second filter part comprise a layer of copper between two layers of silicon nitride.

The second filter part may be vertically separated from the first filter part by an optical thickness of interconnection part in the range between 0.4 and 3 times or between 1 and 3 times the wavelength to be filtered in vacuum.

The second filter part can form a multilayer of layers having a total height above the upper interconnection region in the range between 1000 and 1500 nanometers.

BRIEF DESCRIPTION OF THE DRAWINGS

Other advantages and features of the invention will become apparent upon studying the detailed description of embodiments and of their implementation, taken by way of non-limiting example and illustrated by the appended drawings in which:

FIGS. 1 to 4 illustrate various steps of one embodiment of a method for formation of a filter within an integrated circuit.

DETAILED DESCRIPTION OF THE DRAWINGS

Figure 1:
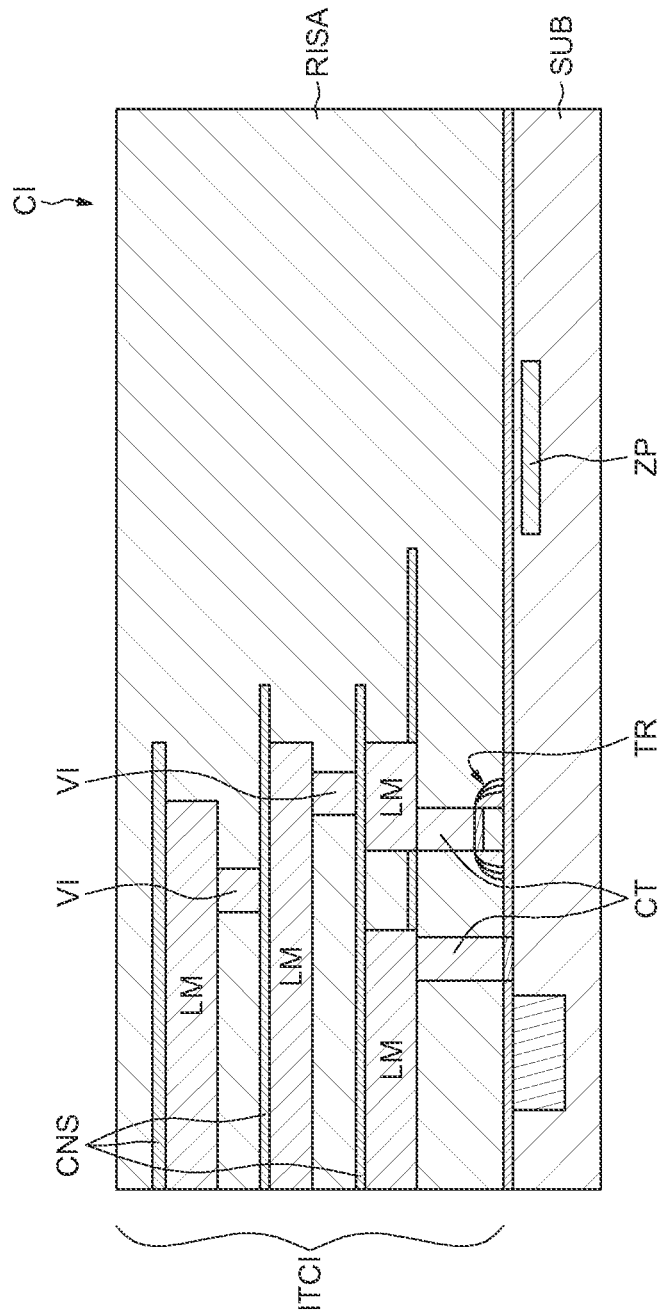

FIG. 1 shows an integrated circuit CI comprising a substrate SUB in which a photosensitive region ZP is formed, for example a photosensitive region ZP with a single-photon avalanche diode.

A transistor TR is also formed together with a set of metal lines LM linked by vias VI and connected to the substrate SUB via contacts CT. FIG. 1 shows three levels of metallization comprising metal lines LM. The metallization levels are separated by layers of silicon nitride CNS ($Si_3N_4$) which extend into the parts comprising metal lines LM, but not over the photosensitive region ZP.

The metal lines LM are formed within an insulating region RISA, for example made of silicon dioxide ($SiO_2$). The assembly formed by this insulating region RISA and by the metal lines LM linked by vias VI forms a lower interconnection region ITCI.

This lower interconnection region ITCI is not a complete interconnection region; as described hereinafter, at least one other level of metallization will be formed within the integrated circuit CI.

As illustrated in FIG. 2, a first optical filter part FL1 can be formed on top of the lower interconnection region ITCI. This first optical filter part comprises for example a metal layer of copper ELMI disposed between two layers of silicon nitride CNF. The formation of the first filter part FL1 can comprise several deposition steps, followed by etching steps designed to etch the layers of silicon nitride CNF and the metal layer ELMI.

The integrated circuit CI is shown in FIG. 3 after the formation of an upper interconnection region ITCS above the interconnection region ITCI and the first filter part FL1. A final metallization level can thus be formed, for example comprising areas accessible for the connection of the integrated circuit CI. Various layers have also been formed on top of the insulating region RISA, here an additional insulating layer RISB, that can comprise silicon dioxide doped with phosphorus ("PSG"), an additional insulating layer RISC, that can comprise silicon nitride, and finally a thin layer of silicon nitride ADH in order to promote the adhesion of metals.

It may be noted that the optical thickness e1 of the upper interconnection region ITCS situated on top of the first filter part FL1 is in the range between 0.4 and 3 times the wavelength to be filtered in vacuum, or between 1 and 3 times the wavelength to be filtered in vacuum.

The second filter part FL2 can subsequently be formed (FIG. 4) over the upper interconnection region ITCS and also over the first filter part FL1. For this purpose, an upper metal layer ELMS can be formed within a multilayer of layers furthermore comprising layers of silicon dioxide OXF and of silicon nitride CNF. The first filter part FL1 and the second filter part FL2 form a multilayer optical filter.

By way of example, the thickness e2 of the second filter part can be in the range between 1000 and 1500 nanometers. These thicknesses correspond to the maximum allowed thicknesses for the filters according to the prior art formed entirely above the interconnection parts. Here, the total thickness of the filter is much greater since the filter runs between the middle of the interconnection part and the top of the second filter part FL2.

It may be noted that, for a filter designed to let through the wavelengths situated in the band going from 850 to 880 nanometers, with the filters obtained according to one aspect, an increase in the transmission that can reach 10 is obtained. In addition, in the neighborhood of 800 nanometers, a reduction in the transmission of a few percent is obtained.

Moreover, whereas in the prior art two layers of copper are formed on top of the interconnection part within the same multilayer, here, only one layer of copper is formed on top of this interconnection part. No over-etch of the highest layer of copper in the filter is obtained, whereas such is the case for the filters according to the prior art when the lowest layer is bounded by etching.

According to one aspect, an improvement in the optical properties of the multilayer filters is obtained.

What is claimed is:

1. An integrated circuit, comprising:
   a substrate;
   an interconnection part; and
   a multilayer optical filter;
   wherein the multilayer optical filter comprises:
      a first metal layer filter part within the interconnection part over a photosensitive region situated within the substrate; and
      a second metal layer filter part above the first metal layer filter part and the interconnection part.

2. The integrated circuit according to claim 1, wherein the interconnection part comprises a lower interconnection region and an upper interconnection region on top of the lower interconnection region, the first metal layer filter part comprising a lower metal layer above the photosensitive region and the lower interconnection region, and the second metal layer filter part comprises an upper metal layer above the upper interconnection region and the lower metal layer.

3. The integrated circuit according to claim 2, wherein the first and the second metal layer filter parts each comprise a layer of copper adjacent to at least one layer of silicon nitride.

4. The integrated circuit according to claim 1, wherein the second metal layer filter part is vertically separated from the first metal layer filter part by an optical thickness of interconnection part in a range between 0.4 and 3 times a wavelength to be filtered in vacuum.

5. The integrated circuit according to claim 1, wherein the second metal layer filter part is vertically separated from the first metal layer filter part by an optical thickness of interconnection part in a range between 1 and 3 times a wavelength to be filtered in vacuum.

6. The integrated circuit according to claim 2, wherein the second metal layer filter part forms a multilayer of layers having a total height above the upper interconnection region in a range between 1000 and 1500 nanometers.

7. An integrated circuit, comprising:
a substrate including a photosensitive region and a transistor;
a plurality of metallization layers on top of the substrate, the metallization layers including metal lines within an insulator, said metal lines located above the transistor but not located above the photosensitive region;
a multilayer optical filter comprising a first metal layer filter part and a second metal layer filter part;
wherein the first metal layer filter part is positioned above the plurality of metallization layers over the photosensitive region;
an insulating structure surrounding and covering the first metal layer filter part and having a top surface; and
wherein the second metal layer filter part is positioned on the top surface of the insulating structure over the first metal layer filter part.

8. The integrated circuit according to claim 7, wherein the second metal layer filter part is vertically separated from the first metal layer filter part by a thickness in a range between 0.4 and 3 times a wavelength in vacuum of an optical signal to be filtered and received by the photosensitive region.

9. The integrated circuit according to claim 7, wherein the second metal layer filter part is vertically separated from the first metal layer filter part by a thickness in a range between 1 and 3 times a wavelength in vacuum of an optical signal to be filtered and received by the photosensitive region.

10. The integrated circuit according to claim 7, wherein the second metal layer filter part is formed of a multilayer of layers having a total thickness in a range between 1000 and 1500 nanometers.

11. An integrated circuit, comprising:
a substrate including a photosensitive region and a transistor;
a plurality of metallization layers on top of the substrate, the metallization layers including metal lines within an insulating structure, said metal lines located above the transistor but not located above the photosensitive region;
a multilayer optical filter comprising:
a first metal layer filter part positioned within the insulating structure and over the photosensitive region; and
a second metal layer filter part positioned above the insulating structure and in alignment with the first metal layer filter part.

12. The integrated circuit according to claim 11, wherein the insulating structure comprises a lower interconnection region and an upper interconnection region on top of the lower interconnection region, the first metal layer filter part comprising a lower metal layer above the photosensitive region and the lower interconnection region, and the second metal layer filter part comprising an upper metal layer above the upper interconnection region and the lower metal layer of the first metal layer filter part.

13. The integrated circuit according to claim 12, wherein the second metal layer filter part forms a multilayer of layers having a total height above the upper interconnection region in a range between 1000 and 1500 nanometers.

14. The integrated circuit according to claim 11, wherein the first and second metal layer filter parts each comprise a layer of copper adjacent at least one layer of silicon nitride.

15. The integrated circuit according to claim 11, wherein the second metal layer filter part is vertically separated from the first metal layer filter part by an optical thickness in a range between 0.4 and 3 times a wavelength to be filtered in vacuum.

16. The integrated circuit according to claim 11, wherein the second metal layer filter part is vertically separated from the first metal layer filter part by an optical thickness in a range between 1 and 3 times a wavelength to be filtered in vacuum.

* * * * *